(12) United States Patent
Mann et al.

(10) Patent No.: US 9,389,379 B1
(45) Date of Patent: Jul. 12, 2016

(54) DUAL OPTICAL AND ELECTRICAL LGA CONTACT

(71) Applicant: International Business Machines Corporation, Armonk, NY (US)

(72) Inventors: Phillip V. Mann, Rochester, MN (US); Kevin M. O'Connell, Rochester, MN (US); Arvind K. Sinha, Rochester, MN (US); Karl Stathakis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/585,411

(22) Filed: Dec. 30, 2014

(51) Int. Cl.
*G02B 6/10* (2006.01)
*G02B 6/43* (2006.01)
*H01R 12/70* (2011.01)
*G02B 6/42* (2006.01)

(52) U.S. Cl.
CPC ............... *G02B 6/43* (2013.01); *G02B 6/4293* (2013.01); *H01R 12/7076* (2013.01)

(58) Field of Classification Search
None
See application file for complete search history.

(56) References Cited

U.S. PATENT DOCUMENTS

| 6,819,813 | B2* | 11/2004 | Howland | G02B 6/12002 372/43.01 |
| 7,099,525 | B2* | 8/2006 | Bakir | G02B 6/12002 385/14 |
| 7,468,558 | B2* | 12/2008 | Bakir | G01R 1/0491 257/773 |
| 7,613,368 | B2* | 11/2009 | Hougham | G02B 6/43 385/14 |
| 7,881,578 | B2 | 2/2011 | Jacobsen et al. | |
| 8,110,415 | B2 | 2/2012 | Knickerbocker et al. | |
| 8,292,634 | B2 | 10/2012 | Takahashi | |
| 2002/0196997 | A1 | 12/2002 | Chakravorty et al. | |

OTHER PUBLICATIONS

Appendix P—List of IBM Patents or Patent Applications Treated as Related—Jun. 14, 2015.

* cited by examiner

*Primary Examiner* — Sung Pak
(74) *Attorney, Agent, or Firm* — Joan Pennington

(57) ABSTRACT

A method and structure are provided for implementing a dual optical and electrical land grid array (LGA) contact. A contact for electrical and optical connection between a module and a printed circuit board (PCB) includes material providing electrical connection and an integrated material providing an optical connection; and the contact is used in a land grid array (LGA) arrangement.

7 Claims, 4 Drawing Sheets

DUAL OPTICAL AND ELECTRICAL LGA CONTACT

FIELD OF THE INVENTION

The present invention relates generally to the data processing field, and more particularly, relates to a method and structures for implementing a dual optical and electrical land grid array (LGA) contact.

DESCRIPTION OF THE RELATED ART

Current sockets that incorporate optical routing typically utilize lenses to direct optical signals to the board or an entirely separate optical module to route optical signals away from the board. In either case, valuable LGA contacts must be removed to make space for the optical pathway away from the module.

A need exists for a method and structure to attach a compact, high density optical and electrical module (i.e. CPU) in a non-permanent fashion (LGA Socket) while maintaining good electrical and optical transmission.

SUMMARY OF THE INVENTION

Principal aspects of the present invention are to provide a method and structures for implementing a dual optical and electrical land grid array (LGA) contact. Other important aspects of the present invention are to provide such method and structure substantially without negative effects and that overcome many of the disadvantages of prior art arrangements.

In brief, a method and structures are provided for implementing a dual optical and electrical land grid array (LGA) contact. A contact for electrical and optical connection between a module and a printed circuit board (PCB) includes material providing electrical connection and an integrated material providing an optical connection; and the contact is configured for use in a land grid array (LGA) arrangement.

In accordance with features of the invention, the contact includes a LGA spring type contact with a core filled with an acrylic or other light pipe style material. The LGA spring type contact provides an electrical signal pathway to the PCB, while the center light pipe provides an optical route.

In accordance with features of the invention, the act of compressing the LGA spring type contact also greatly limits the air gap and hence the light loss from the module to the PCB trace.

In accordance with features of the invention, the structures enable a compact, high density optical and electrical module, for example a CPU module to attach in a non-permanent fashion such as with an LGA socket while maintaining good electrical and optical transmission. The structures allow the module to connect to dual optical-electrical traces.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing a dual optical and electrical land grid array (LGA) contact. A contact for electrical and optical connection between a module and a printed circuit board (PCB) includes material providing electrical connection and an integrated material providing an optical connection; and the contact is configured for use in a land grid array (LGA) arrangement in accordance with preferred embodiments.

Figure 1:
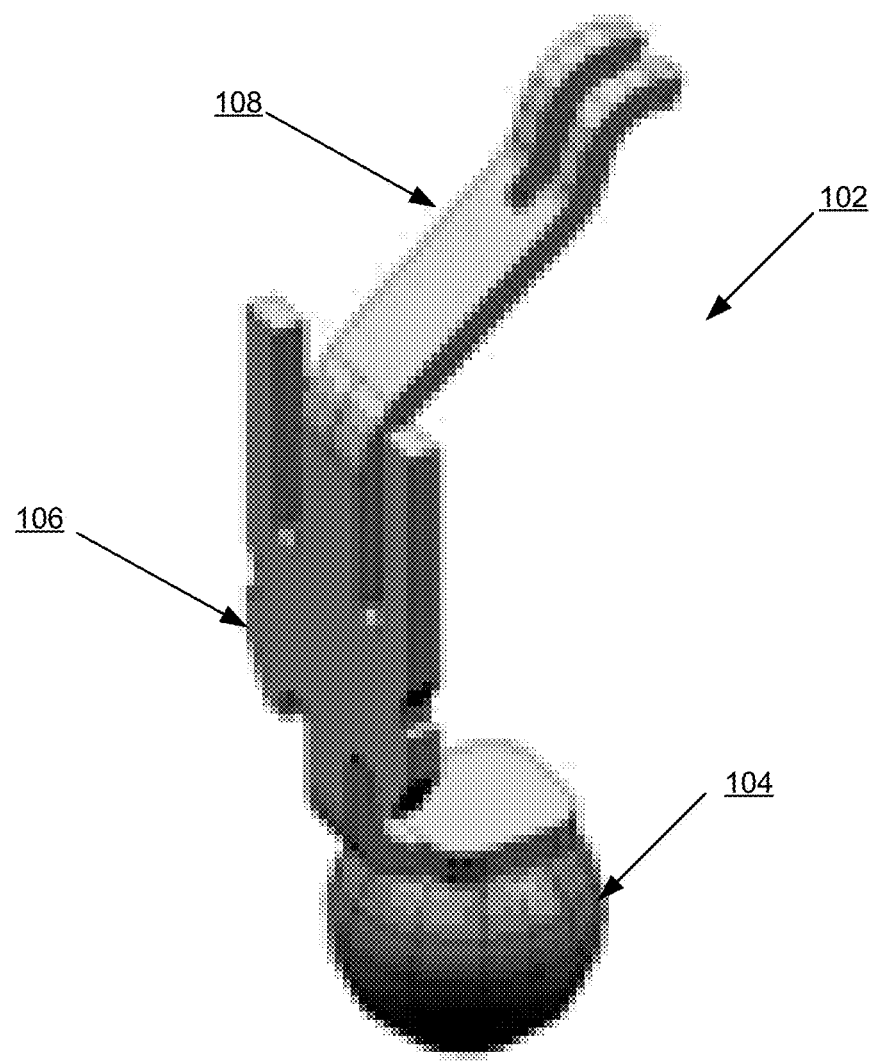
FIG. 1 illustrates an example prior art electrical land grid array (LGA) contact.

Having reference now to the drawings, in FIG. 1, there is shown an example prior art electrical land grid array (LGA) contact generally designated by reference character 100.

The prior art electrical LGA contact structure 100 includes a typical hybrid LGA contact profile generally designated by reference character 102 in accordance with preferred embodiments. The prior art electrical LGA contact structure 100 engages a lower solder ball 104 for electrical connection with a PCB (not shown). The prior art electrical LGA contact structure 100 includes a lower portion 106 extending between the solder ball 104 and an upper portion 108.

Figure 2:
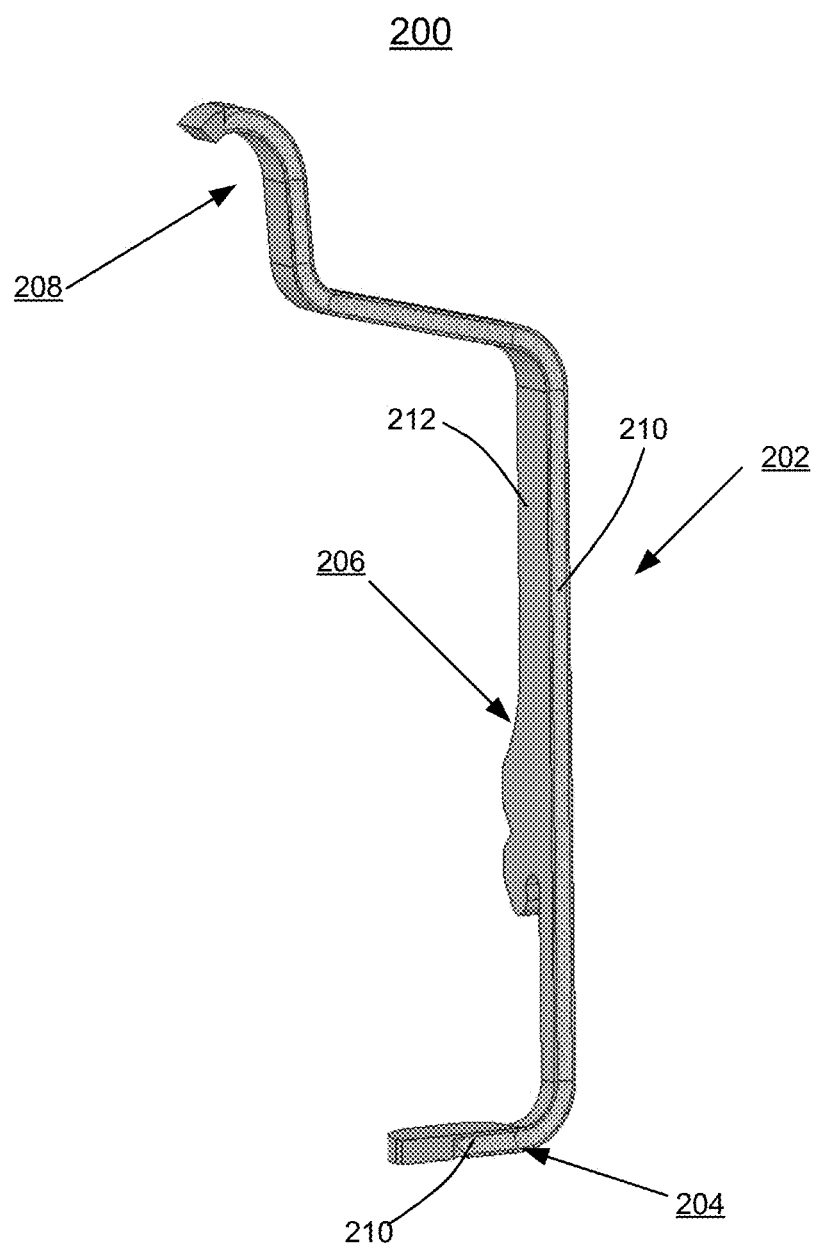
FIG. 2 illustrates an example structure for implementing a dual optical and electrical land grid array (LGA) contact in accordance with the preferred embodiment.

Referring to FIG. 2, there is shown an example structure for implementing a dual optical and electrical land grid array (LGA) contact generally designated by reference character 200 in accordance with the preferred embodiment.

The dual optical and electrical LGA contact structure 200 provides electrical and optical connection between a module and a printed circuit board (PCB) (not shown) includes material providing electrical connection and an integrated material providing an optical connection. The dual optical and electrical LGA contact structure 200 is configured for use in a land grid array (LGA) arrangement in accordance with preferred embodiments.

The dual optical and electrical LGA contact structure 200 includes an LGA contact profile generally designated by reference character 202 in accordance with preferred embodiments. The dual optical and electrical LGA contact structure 200 includes a lower flat portion 204 for electrical connection and optical connection with a PCB (not shown). The dual optical and electrical LGA contact structure 200 includes a middle portion 206 extending between the lower contact portion 204 and an upper portion 208.

The dual optical and electrical LGA contact structure 200 shown in cross section includes an interior or middle portion 210 filled with an acrylic or other light pipe style material. The LGA spring type contact 200 provides an electrical signal pathway provided by the exterior portions 212, while the middle light pipe 210 provides an optical route. The interior portion 210 filled with an acrylic or other light pipe style material extends from the upper contact portion 208 to the lower contact portion 204 providing optical contact with the PCB.

Figure 3:
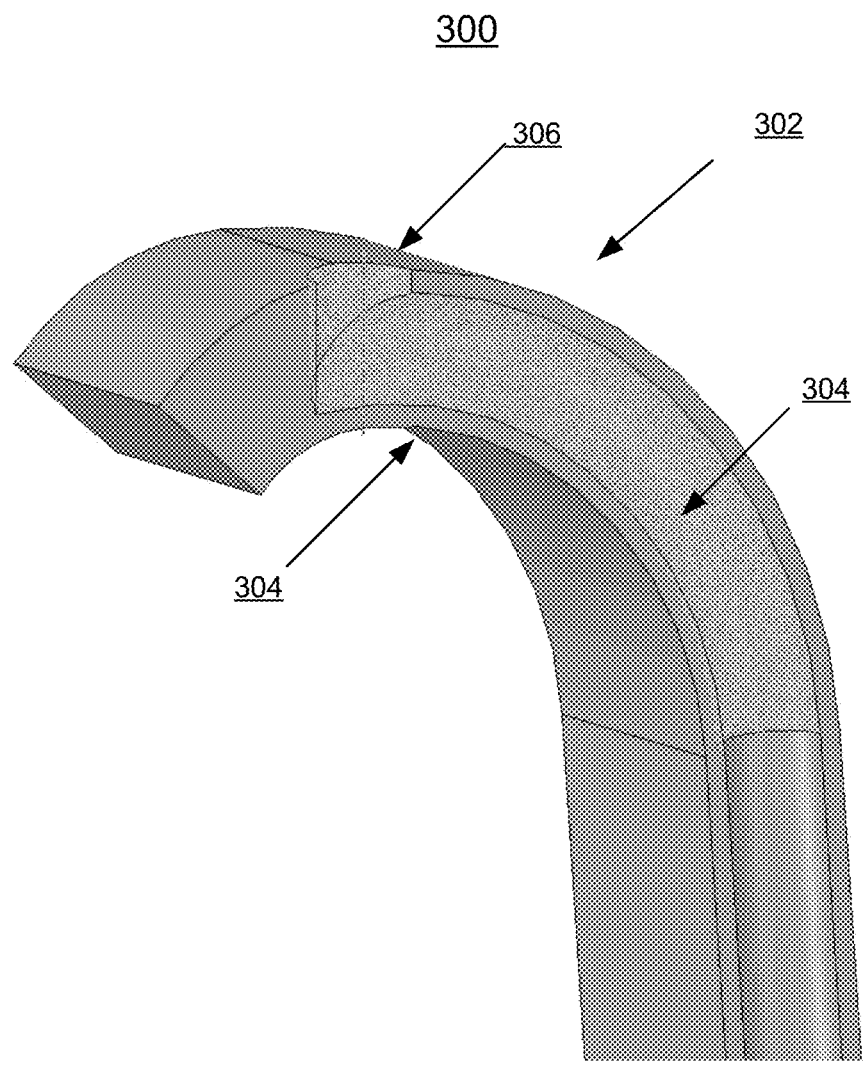
FIG. 3 illustrates another example structure for implementing a dual optical and electrical land grid array (LGA) contact in accordance with the preferred embodiment.

Referring to FIG. 3, there is shown another example structure for implementing a dual optical and electrical land grid array (LGA) contact generally designated by reference character 300 in accordance with the preferred embodiment. As shown, the dual optical and electrical LGA contact structure 300 provides a view of the contact top generally designated by reference character 302. The dual optical and electrical LGA contact structure 300 is similar to embodiment of the dual optical and electrical LGA contact structure 200, but with dual optical paths 304 provided along opposed outer portions 304, allowing a center electrical contact generally designated by reference character 306 to be maintained.

Figure 4:
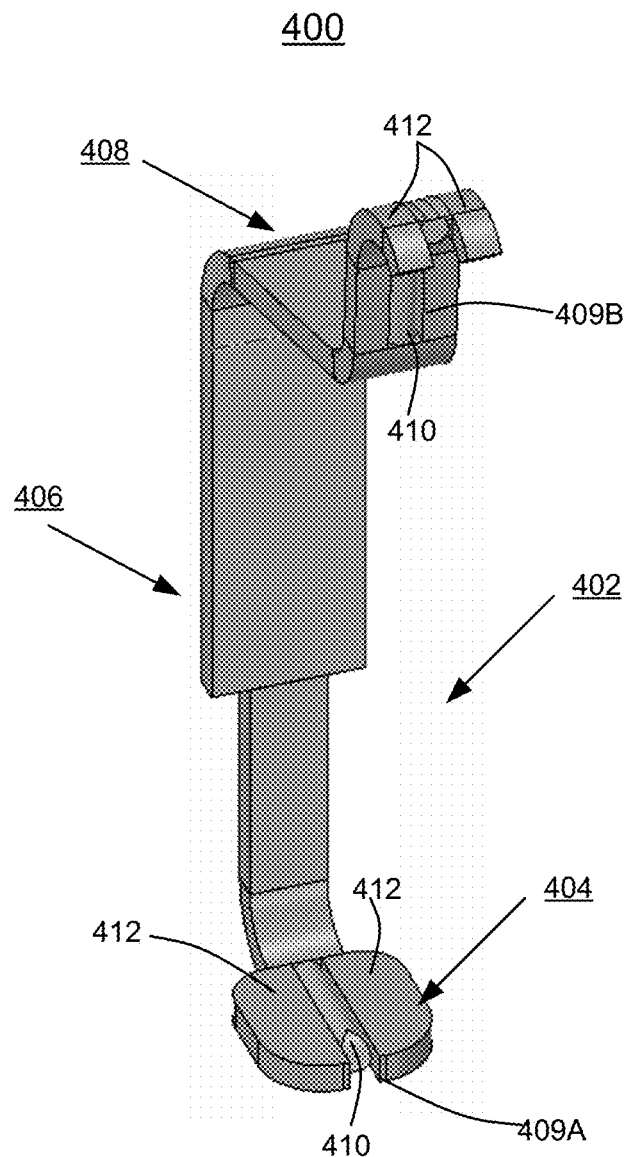
FIG. 4 illustrates another example structure for implementing a dual optical and electrical land grid array (LGA) contact in accordance with the preferred embodiment.

Referring to FIG. 4, there is shown another example structure for implementing a dual optical and electrical land grid array (LGA) contact generally designated by reference character 400 in accordance with preferred embodiments.

The dual optical and electrical LGA contact structure 400 includes an LGA contact profile generally designated by reference character 402 in accordance with preferred embodiments. The dual optical and electrical LGA contact structure 400 includes a lower flat portion 404 for electrical connection and optical connection with a PCB (not shown). The dual optical and electrical LGA contact structure 400 includes a middle portion 406 extending between the lower ball shaped portion 404 and an upper portion 408.

The dual optical and electrical LGA contact structure 400 is formed with a respective hole 409A, 409B in lower portion 404 and the upper portion 408 and injected with light pipe style material 410 and formed to the appropriate shape. The LGA spring type contact 400 provides an electrical signal pathway provided by opposed split electrical connection exterior portions 412, while the middle light pipe 210 provides an optical route. The widened region of the lightpipe 410 at the top portion 408 is slightly recessed from the metal contact surface 412 of the LGA pin to ensure that good electrical contact occurs. Light is sent from the module base (not shown) and into the LGA lightpipe 410 through the wide receiving side at the top portion 408. Light is then transmitted through the light pipe portion 410 and emitted at the base portion 404, into the receiving side of the board (not shown).

While the present invention has been described with reference to the details of the embodiments of the invention shown in the drawing, these details are not intended to limit the scope of the invention as claimed in the appended claims.

What is claimed is:

1. A structure for implementing a dual optical and electrical land grid array (LGA) contact comprising:
   a contact separately providing both electrical and optical connection between a module and a printed circuit board (PCB);
   said contact including material providing electrical connection and an integrated material providing an optical connection;
   said contact being used in a land grid array (LGA) arrangement;
   each said contact providing a dual optical and electrical land grid array (LGA) contact having said electrical connection contact material disposed proximate to said optical connection integrated material and including a lower flat contact portion providing electrical connection and optical connection with the printed circuit board (PCB); said electrical connection contact material and said optical connection integrated material extending between the lower flat contact portion and an upper contact portion; and said optical connection integrated material being recessed from a contact surface of said upper contact portion of said electrical connection contact material ensuring effective electrical connection be maintained with the module.

2. The structure as recited in claim 1 wherein said contact includes an LGA spring type contact.

3. The structure as recited in claim 1 wherein said integrated material providing an optical connection includes an acrylic material.

4. The structure as recited in claim 1 wherein said integrated material providing an optical connection includes a selected light pipe material.

5. The structure as recited in claim 1 wherein said integrated material providing an optical connection includes a generally central located light pipe material.

6. The structure as recited in claim 1 wherein said contact includes a hybrid LGA contact with a light conduit in a middle contact portion.

7. The structure as recited in claim 1 wherein said contact includes a hybrid LGA contact coated in lightpipe material.

* * * * *